United States Patent
Nakagome et al.

(10) Patent No.: US 12,471,297 B2
(45) Date of Patent: Nov. 11, 2025

(54) SEMICONDUCTOR DEVICE AND MANUFACTURING METHOD THEREOF

(71) Applicant: FUJI ELECTRIC CO., LTD., Kawasaki (JP)

(72) Inventors: Akito Nakagome, Matsumoto (JP); Ryoichi Kato, Matsumoto (JP); Yoshinari Ikeda, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 885 days.

(21) Appl. No.: 17/564,922

(22) Filed: Dec. 29, 2021

(65) Prior Publication Data

US 2022/0262895 A1 Aug. 18, 2022

(30) Foreign Application Priority Data

Feb. 17, 2021 (JP) ................................. 2021-023578

(51) Int. Cl.
*H01L 49/02* (2006.01)
*H10D 1/00* (2025.01)
*H10D 1/68* (2025.01)

(52) U.S. Cl.
CPC ............. *H10D 1/043* (2025.01); *H10D 1/716* (2025.01)

(58) Field of Classification Search
CPC .... H05K 1/0256; H05K 1/0306; H01L 23/15; H01L 23/3735
See application file for complete search history.

(56) References Cited

U.S. PATENT DOCUMENTS

| | | | |
|---|---|---|---|
| 5,986,218 A * | 11/1999 | Muto ................. | H01L 21/4846 174/250 |
| 2002/0125563 A1* | 9/2002 | Scheuermann ..... | H01L 23/3735 257/E23.173 |
| 2006/0086981 A1 | 4/2006 | Yamaguchi et al. | |
| 2008/0049476 A1 | 2/2008 | Azuma et al. | |
| 2009/0002956 A1 | 1/2009 | Suwa et al. | |
| 2012/0127684 A1 | 5/2012 | Matsumoto et al. | |

(Continued)

FOREIGN PATENT DOCUMENTS

| | | |
|---|---|---|
| EP | 1650859 A2 | 4/2006 |
| EP | 2015626 A2 | 1/2009 |

(Continued)

OTHER PUBLICATIONS

Yuichiro Hinata et al., "Enhanced Breakdown Voltage for All-SiC Module", Fuji Electric Journal, 2016, vol. 89, No. 4, pp. 242-246.

(Continued)

*Primary Examiner* — Jarrett J Stark
(74) *Attorney, Agent, or Firm* — Rabin & Berdo, P.C.

(57) ABSTRACT

A semiconductor device includes a terminal portion including a second external terminal, an insulating sheet disposed on the second external terminal, and a first external terminal disposed on the insulating sheet. The first external terminal has a first end portion with a first end. At the first end portion, a rear surface of the first external terminal is not parallel to a front surface of the second external terminal so that, in a thickness direction of the first external terminal, a distance between the first external terminal and the second external terminal increases with as the first end is approached.

13 Claims, 11 Drawing Sheets

(56) References Cited

U.S. PATENT DOCUMENTS

2015/0131232 A1  5/2015  Ishino et al.
2017/0025344 A1  1/2017  Kanai

FOREIGN PATENT DOCUMENTS

| | | |
|---|---|---|
| EP | 2485254 A1 | 8/2012 |
| JP | H09135057 A | 5/1997 |
| JP | H1126691 A | 1/1999 |
| JP | 2001057409 A | 2/2001 |
| JP | 2002270730 A | 9/2002 |
| JP | 2006121834 A | 5/2006 |
| JP | 2007234694 A | 9/2007 |
| JP | 2008029117 A | 2/2008 |
| JP | 2009005512 A | 1/2009 |
| JP | 2012009815 A | 1/2012 |
| JP | 2014011338 A | 1/2014 |
| JP | 2017028132 A | 2/2017 |
| JP | 2019197816 A | 11/2019 |
| WO | 2011040054 A1 | 4/2011 |

OTHER PUBLICATIONS

Japanese Patent Office Action issued on Oct. 1, 2024, for corresponding Japanese Patent Application No. 2021-023578.
Japanese Office Action dated Jan. 7, 2025, in the counterpart Japanese Patent Application No. 2021-023578.

* cited by examiner

|  | NO ROUNDED STRUCTURE | fr_R0.5 + si_R0.5 | fr_R0.75 + si_R0.75 | fr_R1.0 + si_R1.0 |
|---|---|---|---|---|
| ELECTRIC FIELD REDUCTION RATE/ ELECTRIC FIELD STRENGTH [V/m] | 100%/ 1.2E+07 | 76%/ 9.17E+06 | 26%/ 3.08E+06 | 27%/ 3.23E+06 |

| | NO ROUNDED STRUCTURE | fr_R0.5 + si_R0.5 | fr_R0.75 + si_R0.75 | fr_R1.0 + si_R1.0 |
|---|---|---|---|---|
| ELECTRIC FIELD REDUCTION RATE/ ELECTRIC FIELD STRENGTH [V/m] | 100%/ 12E+07 | 76%/ 9.17E+06 | 26%/ 3.08E+06 | 27%/ 3.23E+06 |
| se_R0.5 + fi_R0.5 | – | 34%/ 4.08E+06 | 27%/ 4.38E+06 | 25%/ 3.05E+06 |
| se_R1 + fi_R1 | – | 21%/ 2.49E+06 | 34%/ 4.06E+06 | 20%/ 2.4E+06 |
| se_R1.5 + fi_R1.5 | – | 13%/ 1.59E+06 | 17%/ 1.98E+06 | 17%/ 1.98E+06 |

FIG. 11

SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2021-023578, filed on Feb. 17, 2021, the entire contents of which are incorporated herein by reference.

BACKGROUND OF THE INVENTION

1. Field of the Invention

The embodiments discussed herein relate to a semiconductor device and a manufacturing method thereof.

2. Background of the Related Art

In many cases, a semiconductor device used for a power conversion device is configured as follows. First, semiconductor chips are mounted on wiring patterns on an insulating substrate by soldering. One end of an individual external terminal formed integrally with a terminal case is bonded to a corresponding wiring pattern on the insulating substrate. The semiconductor chips and the wiring patterns, the wiring patterns and the external terminals, or the semiconductor chips and the external terminals are bonded to each other by using metal wires or the like. By injecting filling material into the inside of the terminal case, the inside of the terminal case is sealed with the filling material (see Japanese Laid-open Patent Publication No. 11-26691 (FIG. 1)). A metal plate is bonded by soldering to a metal foil formed on a surface opposite to the surface of the insulating substrate on which the semiconductor chips are mounted. By attaching a heat radiation fin or the like to the outer surface of this metal plate, the heat generated by the semiconductor chips is released to the outside.

In the case of such a semiconductor device, as a higher voltage is handled, a higher insulating strength with respect to the insulating substrate needs to be ensured. Thus, it is known that the electric field at a high electric field portion is reduced by making an upper creepage distance from an edge of metallic coating corresponding to a wiring pattern to an edge of an insulating substrate less than a lower creepage distance from an edge of metallic coating corresponding to a metal foil to the edge of the insulating substrate (see Japanese Laid-open Patent Publication No. 2002-270730 (FIG. 4)). It is also known that electric field reduction and deficiency reduction are achieved by injecting insulating material whose dielectric constant is lower than that of the filling material with which the space between insulating substrate and metal plate is filled, in addition to making the upper creepage distance less than the lower creepage distance. These reduction effects consequently improve the insulation performance (see Japanese Laid-open Patent Publication No. 2012-9815 (FIG. 3)).

In addition, there is a semiconductor device including a circuit plate formed by copper plates disposed on upper and lower surfaces of an insulating ceramic substrate. These copper plates are disposed inside the outer periphery of the insulating substrate, and an end portion of the upper copper plate is disposed inside an end portion of the lower copper plate. Except for the lower surface of the lower copper plate, the insulating substrate, the upper copper plate, and the lower copper plate are sealed with resin. It is known that the electric field is concentrated on the end portion of the upper copper plate that is brought into contact with the insulating substrate (see HINATA, Yuichiro, et al., Fuji Electric Journal, 2016, Vol. 89, no. 4, pp. 242-246). In addition, there is a circuit substrate formed by an insulating ceramic substrate, an upper conductor layer, which is an electric circuit pattern that is disposed inside the outer periphery of the insulating substrate and that is disposed on an upper surface of the insulating substrate, a lower conductor layer, which is disposed inside the outer periphery of the insulating substrate in a plan view, extends farther toward the outside than an end portion of the above conductor layer, and is disposed on a lower surface of the insulating substrate. It is known that the electric field is reduced by forming the upper conductor layer to have a cross section structure such that an end portion of a bonded surface of the upper conductor layer and the insulating substrate is located inside the outermost end portion of the upper conductor layer (see Japanese Laid-open Patent Publication No. H09-135057 (FIG. 4)).

There is also known a technique in which a curved surface is formed on an end portion of a concave portion of an insulating substrate disposed on a base substrate, a metal layer is formed at this concave portion, and a circuit-side conductor is disposed on the metal layer (see Japanese Laid-open Patent Publication No. 2001-57409 (FIG. 1)).

In addition, there is known a technique in which solder for bonding a front electrode corresponding to a wiring pattern to an insulating substrate is formed to protrude toward a side surface of the insulating substrate. It is known that the electric field strength at the upper end portion of the surface electrode is reduced since the protruded portion blocks the space between the front electrode and the back electrode of the insulating substrate (see Japanese Laid-open Patent Publication No. 2019-197816 (FIG. 6)).

In addition, there is a technique in which an intersection of a main surface of an insulating substrate and a side surface of a conductor plate disposed on this main surface is coated with ion gel containing ionic liquid. It is known that the local electric field concentration at this intersection is reduced and that the dielectric strength voltage is improved (see Japanese Laid-open Patent Publication No. 2017-28132 (FIG. 1)).

In addition, there is a technique for reducing the electric field concentration at an end portion of a wiring pattern to which a high voltage is applied in a semiconductor device (see International Publication Pamphlet No. WO2011/040054 (FIG. 8)). In the case of this semiconductor device, between two neighboring wiring patterns having a potential difference among wiring patterns on which a plurality of sets of semiconductor chips are mounted, another wiring pattern having a potential between the potentials of the neighboring wiring patterns is disposed.

There is a semiconductor device having external terminals to which a large-capacity capacitor is externally connectable (see Japanese Laid-open Patent Publication No. 2007-234694 (FIG. 1)). Such a capacitor is for smoothing fluctuation of an inputted direct current (DC) power supply voltage. The external terminals of the semiconductor device are electrically connected to electrodes of the capacitor by ultrasonic bonding. Regarding the electrodes of the capacitor, a plate-like positive external electrode and a plate-like negative external electrode are disposed parallel to each other via an insulating member. In this way, occurrence of the inductance at the electrodes of the capacitor is reduced, and the resistance value is reduced at the individual bonding portion.

In addition, there is known a power module, from a side surface of which a plurality of plate-like conductors sandwiching an insulating plate protrude. An end portion of an upper conductor matches an end portion of the insulating plate in a plan view. In the case of this power module, tip portions of individual DC bus bars connected to positive and negative electrodes of the smoothing capacitor are electrically connected to positive-side and negative-side main electrodes by solder material (see Japanese Laid-open Patent Publication No. 2009-5512 (FIG. 4) and Japanese Laid-open Patent Publication No. 2006-121834 (FIG. 1)).

Regarding each of the conventional semiconductor devices, reduction of the electric field concentration at an end portion of a wiring pattern on a circuit board in the device has been described. However, since a high voltage equivalent to that applied to a wiring pattern is applied to an individual external terminal to which a capacitor is connected, if a high voltage is applied for a long time to a portion where electric field concentration occurs, an insulating member deteriorates and insulation failure consequently occurs.

SUMMARY OF THE INVENTION

According to an aspect, there is provided a semiconductor device including: a first external terminal having a first end portion, the first end portion having a first end; a second external terminal having a front surface, the front surface having a first area and a second area, the first external terminal being disposed above the front surface of the second external terminal within the second area in a plan view of the semiconductor device; and an insulating sheet disposed between the first external terminal and the second external terminal, and being provided on the front surface of the second external terminal within the second area and adjacent to the first area, wherein at the first end portion, a rear surface of the first external terminal is not parallel to the front surface of the second external terminal so that, in a thickness direction of the first external terminal, a distance between the first external terminal and the second external terminal increases as the first end is approached.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings in which like reference characters denote like components. An individual embodiment may be implemented by partially combining a plurality of embodiments without causing inconsistency.

First Embodiment

Figure 1:
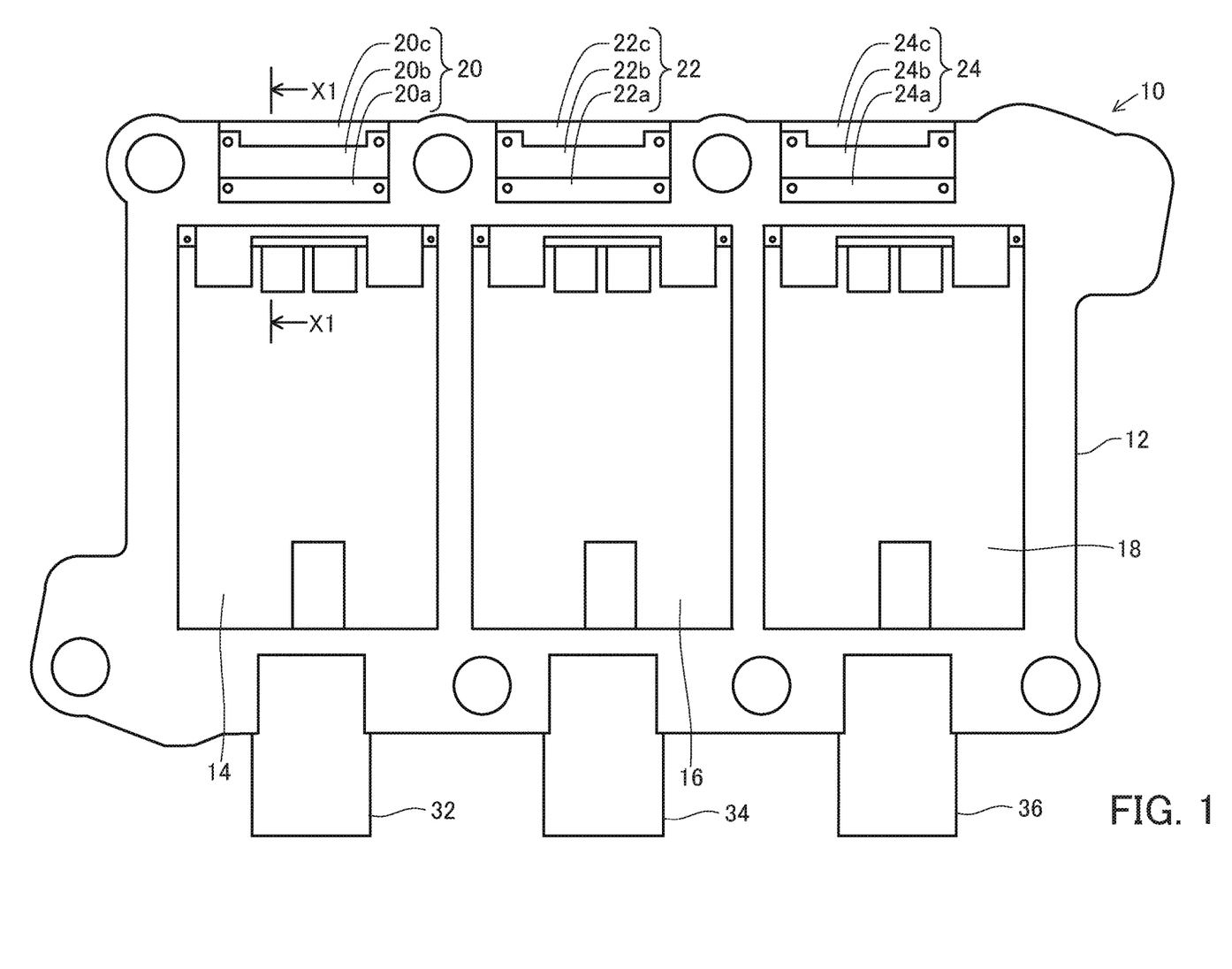
FIG. 1 is a plan view of a semiconductor device according to a first embodiment.
Figure 2:
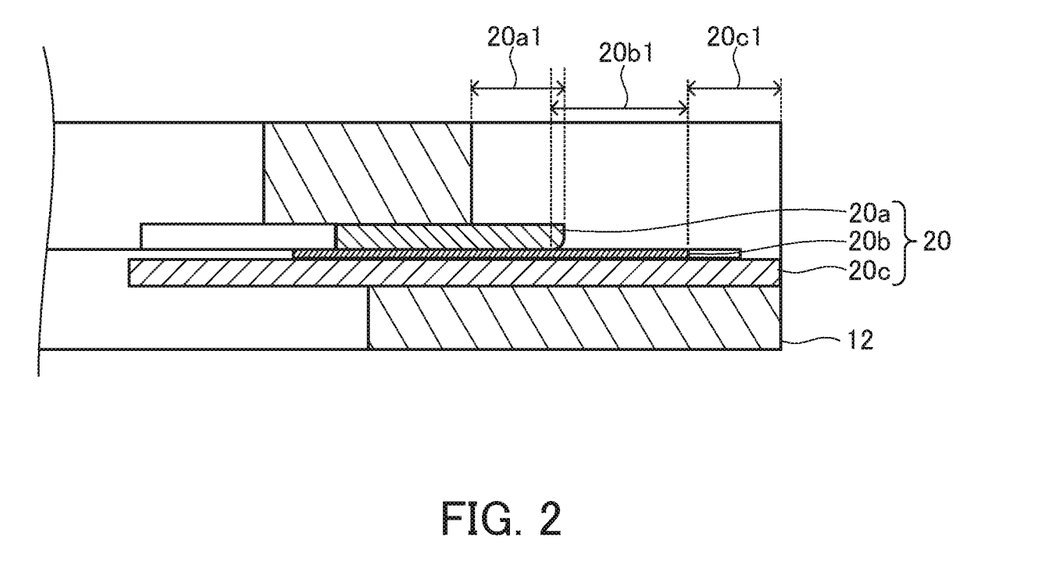
FIG. 2 is a sectional view taken along a line X1-X1 in FIG. 1.
Figure 3:
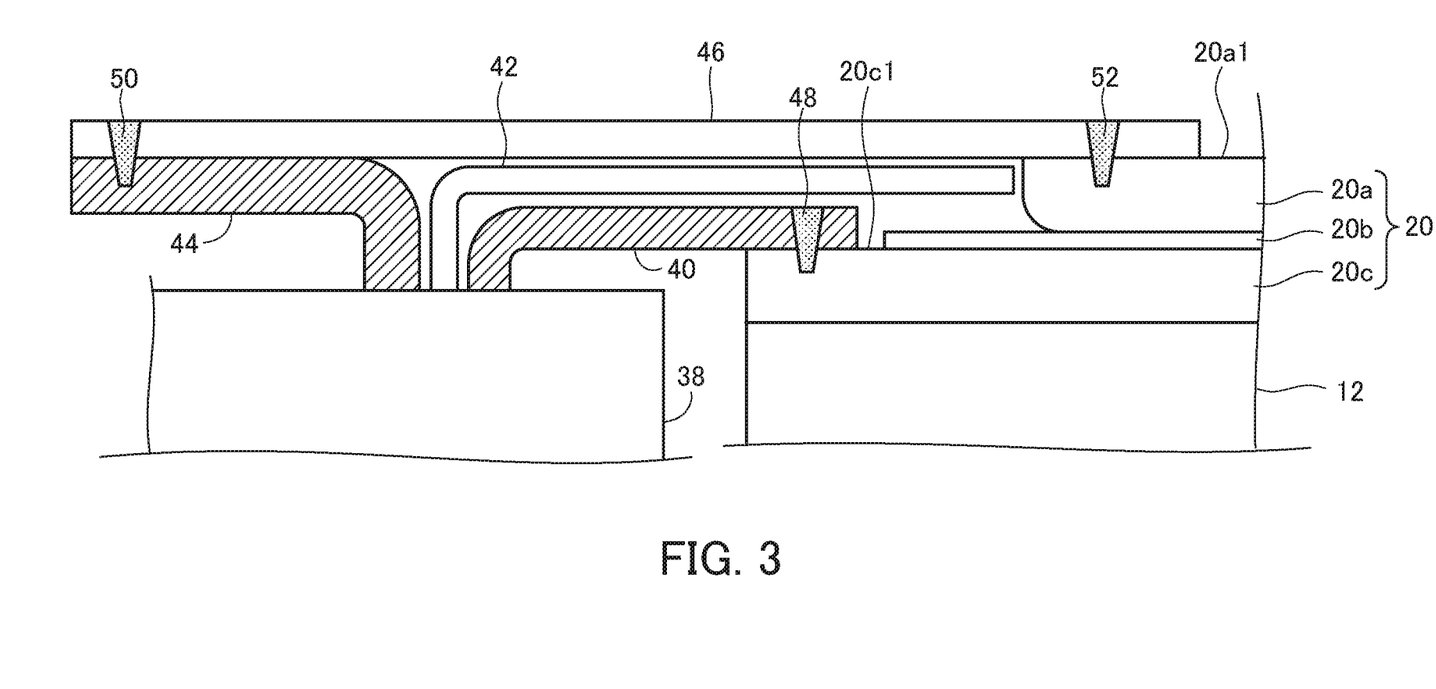
FIG. 3 is a sectional view of a connection state between a terminal portion of the semiconductor device according to the first embodiment and a capacitor.

FIG. 1 is a plan view of a semiconductor device according to a first embodiment. FIG. 2 is a sectional view taken along a line X1-X1 in FIG. 1. FIG. 3 is a sectional view of a connection state between a terminal portion of the semiconductor device according to the first embodiment and a capacitor.

This semiconductor device 10 according to the first embodiment may be used as a power conversion device used for an inverter for driving a three-phase motor, for example. The semiconductor device 10 used for such a purpose has a function of receiving a DC obtained by rectifying and smoothing an alternating current (AC) supplied from a power supply and converting the DC into an AC again for driving a three-phase motor.

The semiconductor device 10 includes a case 12 constituting a rectangular frame. This case 12 has three circuit storage portions 14, 16, and 18 lined in its longitudinal direction. For example, a U-phase drive circuit is stored in the circuit storage portion 14, a V-phase drive circuit is stored in the circuit storage portion 16, and a W-phase drive circuit is stored in the circuit storage portion 18. In FIG. 1, illustration of the U-phase drive circuit, the V-phase drive circuit, the W-phase drive circuit, control terminals, etc. is omitted.

The case 12 is formed by insert molding in which heated and melted thermoplastic resin is injected into an injection mold into which various kinds of terminals for connection to external circuits are inserted and these inserted terminals and resin are integrated. Examples of the thermoplastic resin include polyphenylene sulfide (PPS) resin, polybutylene terephthalate (PBT) resin, polybutylene succinate (PBS) resin, polyamide (PA) resin, and acrylonitrile butadiene styrene (ABS) resin. As its terminals, the case 12 includes terminal portions 20, 22, and 24 to which a large-capacity capacitor for stabilizing an input DC voltage is connected, a U-phase output terminal 32, a V-phase output terminal 34, and a W-phase output terminal 36.

The terminal portion 20 includes a first external terminal 20a connected to a positive terminal (a P terminal) of the capacitor, an insulating sheet 20b, and a second external terminal 20c connected to a negative terminal (an N terminal) of the capacitor. The terminal portion 22 includes a first external terminal 22a connected to a positive terminal (a P terminal) of the capacitor, an insulating sheet 22b, and a second external terminal 22c connected to a negative terminal (an N terminal) of the capacitor. The terminal portion 24 includes a first external terminal 24a connected to a positive terminal (a P terminal) of the capacitor, an insulating sheet 24b, and a second external terminal 24c connected to a negative terminal (an N terminal) of the capacitor.

Since these terminal portions 20, 22, and 24 have the same configuration, the terminal portion 20 will hereinafter be described as a representative example. As illustrated in the sectional view in FIG. 2, the terminal portion 20 has a laminated structure. Specifically, the insulating sheet 20b is disposed on a front surface (an upper surface in FIG. 2) of the second external terminal 20c, and the first external terminal 20a is disposed on a front surface of the insulating sheet 20b. An outer end portion (a right-side end portion in FIG. 2) of the second external terminal 20c of the terminal portion 20 matches an outer wall surface of the case 12. In addition, an outer end portion of the insulating sheet 20b is located inwardly away from the outer end portion of the second external terminal 20c, and an outer end portion of the first external terminal 20a is located inwardly away from the outer end portion of the insulating sheet 20b. That is, the first external terminal 20a, the insulating sheet 20b, and the second external terminal 20c are formed in a staircase pattern as a whole. The second external terminal 20c of the terminal portion 20 has a front surface having a first area and a second area other than the first area. The insulating sheet 20b is disposed within the second area on the front surface of the second external terminal 20c, and the first area that is a part of the front surface and serves as a terrace area 20c1 between the outer end portion of the second external terminal 20c and the outer end portion of the insulating sheet 20b. The insulating sheet 20b of the terminal portion 20 has a front surface on which the first external terminal 20a is disposed, and a part of the front surface serves as an insulating area 20b1 between an area that is brought into contact with the first external terminal 20a and the terrace area 20c1. Since the insulating area 20b1 is exposed to the air, the insulation creepage distance or the insulation clearance distance between the terminals need to be ensured. Thus, the insulating area 20b1 needs to be set based on the standards corresponding to the rated voltage of the product. Thus, when the difference between the potentials applied to the first external terminal 20a and the second external terminal 20c is larger, the insulating area 20b1 needs to protrude further from the end portion of the first external terminal 20a. In this way, the insulation creepage distance or the insulation clearance distance is sufficiently ensured. The first external terminal 20a of the terminal portion 20 has a front surface protruding from the case 12, and this front surface serves as an exposed area 20a1.

As illustrated in FIG. 3, the terminal portion 20 is a terminal electrically connected to a capacitor 38. The capacitor 38 includes a first connection terminal 40, a flexible insulating sheet 42, and a second connection terminal 44, which extend from the upper surface of a capacitor case. After extending from the capacitor case, the first connection terminal 40 of the capacitor 38 bends in the right direction in FIG. 3 and extends parallel to an upper surface of the capacitor case. After extending from the capacitor case, the second connection terminal 44 bends in the left direction in FIG. 3 at a location higher than the height of the first connection terminal 40 and extends parallel to the upper surface of the capacitor case.

Next, an example of the connection between the semiconductor device 10 and the capacitor 38 will be described. The first external terminal 20a of the terminal portion 20 of the semiconductor device 10 is bonded to the second connection terminal 44 of the capacitor 38 via a plate-like coupling member 46, and the second external terminal 20c of the terminal portion 20 is directly bonded to the first connection terminal 40 of the capacitor 38. The capacitor 38 and the terminal portion 20 are bonded in the following order. First, an end portion of the first connection terminal 40 of the capacitor 38 is placed on the terrace area 20c1 of the second external terminal 20c, and the first connection terminal 40 of the capacitor 38 and the second external terminal 20c of the terminal portion 20 are bonded to each other at a welding location 48 by laser welding. Next, the insulating sheet 42 is bent to cover the welding location 48, and the coupling member 46 is placed over an upper surface of the second connection terminal 44 of the capacitor 38 and the exposed area 20a1 of the first external terminal 20a. Next, the coupling member 46 and the second connection terminal 44 of the capacitor 38 are bonded to each other at a welding location 50 by laser welding, and the coupling member 46 and the first external terminal 20a of the terminal portion 20 are bonded to each other at a welding location 52 by laser welding.

In this way, since the negative and positive conductors of the semiconductor device 10 and the capacitor are disposed parallel to each other via the insulating sheet 20b and the insulating sheet 42, currents flow in opposite directions. Thus, the inductance at this coupling portion is reduced.

Next, the terminal portion 20 of the semiconductor device 10 will be described in detail.

Figure 4A:
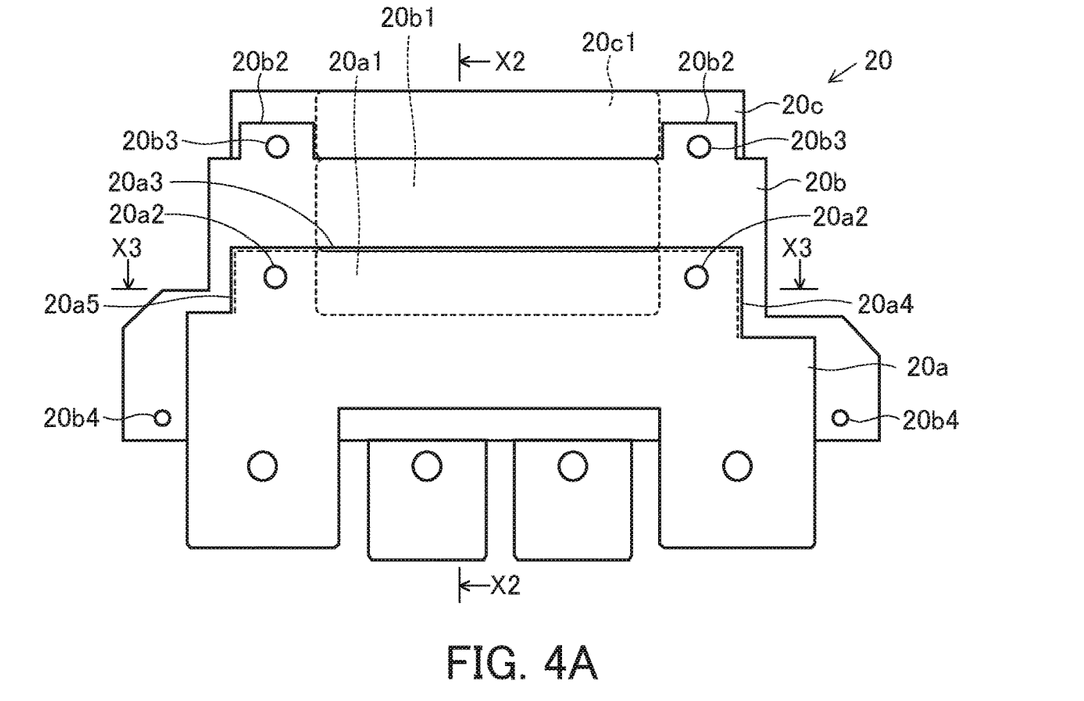
FIGS. 4A and 4B are a plan view and a bottom view of a configuration of the terminal portion.
Figure 4B:
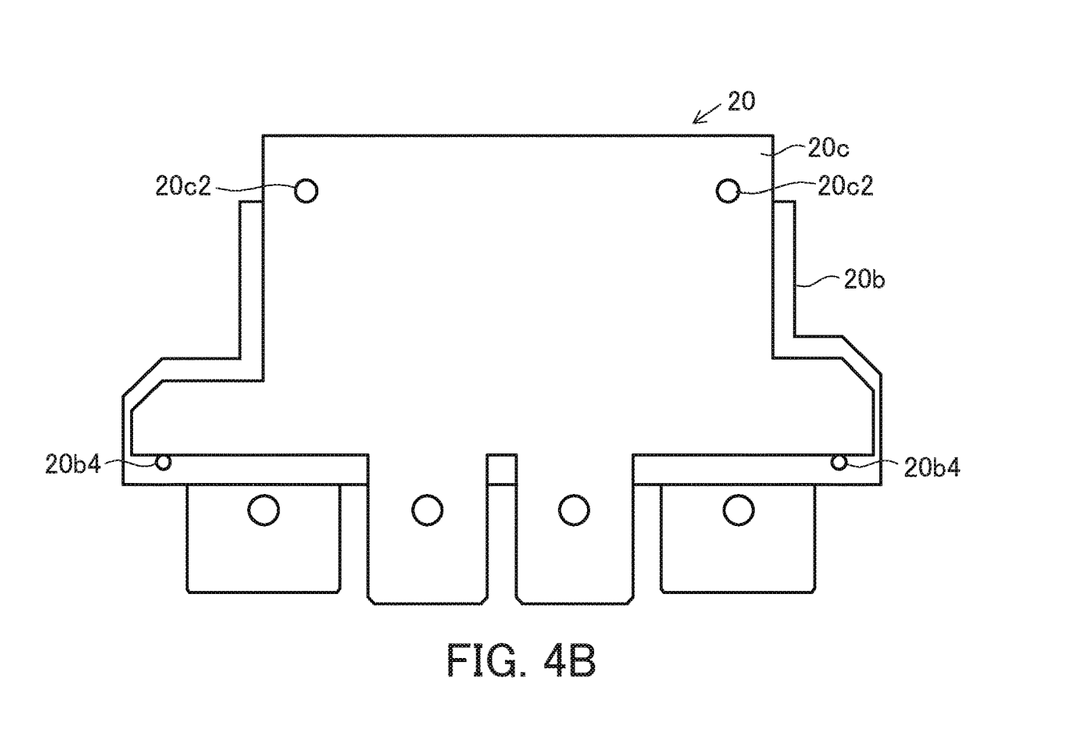
Figure 5:
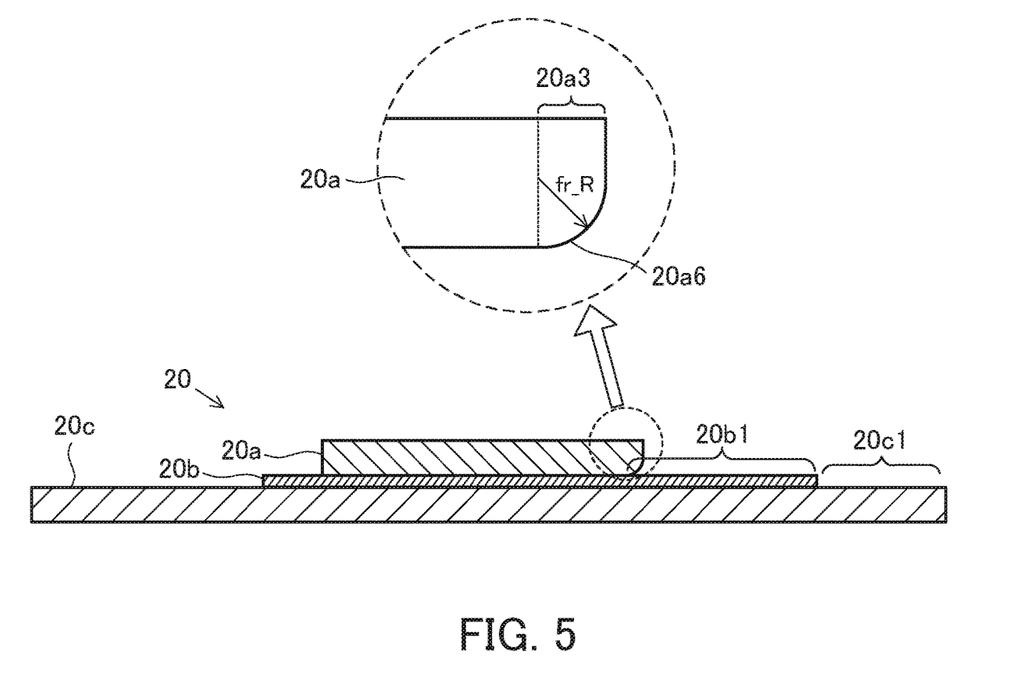
FIG. 5 is a sectional view taken along a line X2-X2 in FIG. 4A.
Figure 6:
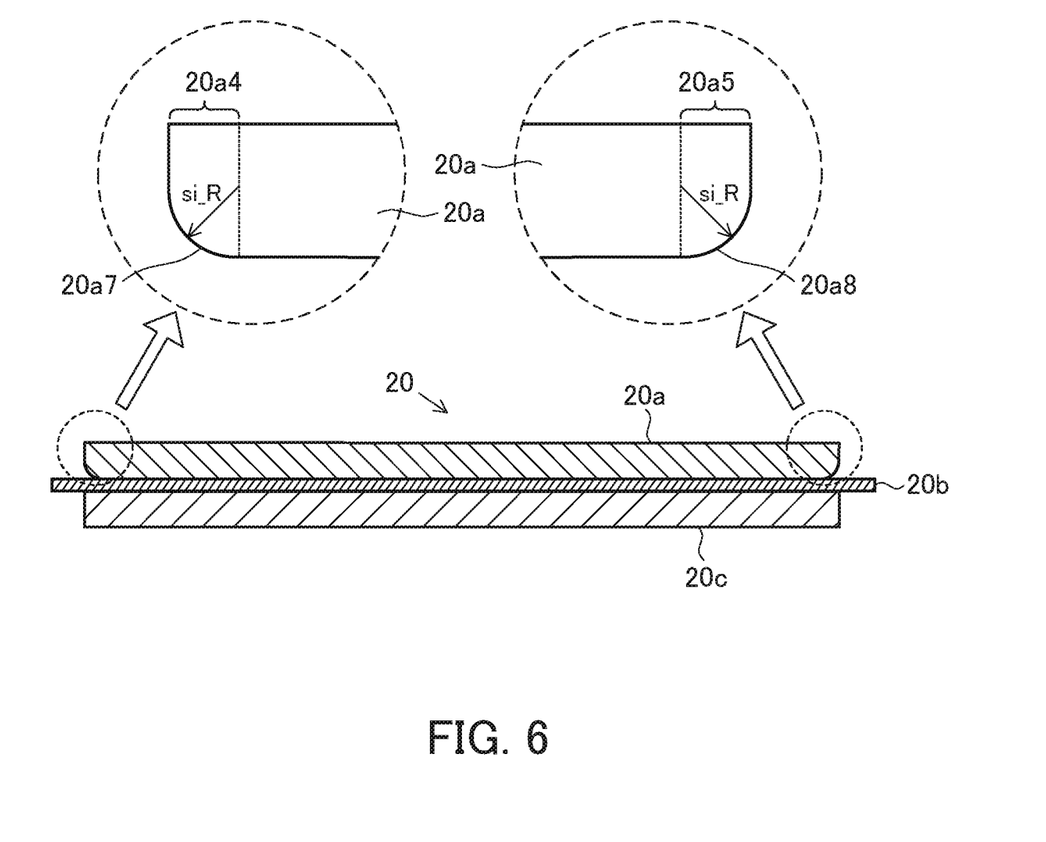
FIG. 6 is a sectional view taken along a line X3-X3 in FIG. 4A.
Figure 7:
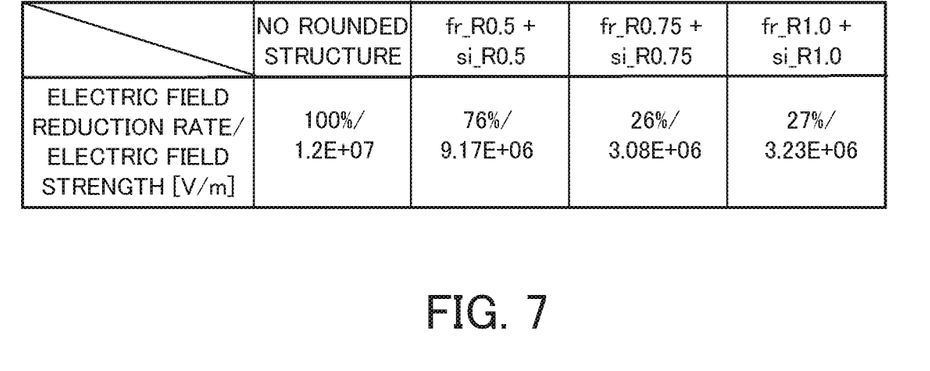
FIG. 7 illustrates an electric field reduction effect.

FIGS. 4A and 4B are a plan view and a bottom view of a configuration of the terminal portion 20. FIG. 5 is a sectional view taken along a line X2-X2 in FIG. 4A. FIG. 6 is a sectional view taken along a line X3-X3 in FIG. 4A. FIG. 7 illustrates an electric field reduction effect.

As illustrated in FIGS. 4A and 4B, the terminal portion 20 of the semiconductor device 10 has a laminated structure. Specifically, the first external terminal 20a is disposed on the insulating sheet 20b and the insulating sheet 20b is disposed on the second external terminal 20c. The first external terminal 20a has a front surface, and the exposed area 20a1 is located at a center portion of an outer end portion on the front surface. The insulating sheet 20b has a front surface, and the insulating area 20b1 that is not brought into contact with the first external terminal 20a is located at the center of an outer end portion on the front surface. The second external terminal 20c has a front surface, and the terrace area 20c1 is located at the center portion of an outer end portion on the front surface.

The first external terminal 20a has through-holes 20a2 on two sides of the exposed area 20a1 along a side at the outer end portion. The insulating sheet 20b has through-holes 20b3 in extended portions 20b2 extending from a side at the center of the outer end portion on two sides of the insulating area 20b1. In addition, the insulating sheet 20b has through-holes 20b4, each of which is located near a side at an inner end portion that does not overlap the first external terminal 20a in a plan view. The second external terminal 20c has through-holes 20c2 at locations that overlap the through-holes 20b3 of the insulating sheet 20b in a plan view. These through-holes 20a2, 20b3, 20b4, and 20c2 are used for positioning the first external terminal 20a, the insulating sheet 20b, and the second external terminal 20c within the injection mold.

The first external terminal 20a and the second external terminal 20c are made of copper or a copper alloy. The first external terminal 20a has a thickness of 0.6 mm or more. The first external terminal 20a may have a thickness between 0.8 mm and 1.2 mm, inclusive. The insulating sheet 20b may be a single sheet or may be formed by stacking a plurality of sheets. The insulating sheet 20b is thinner than the thickness of the first external terminal 20a and has a thickness of 0.05 mm or more. As a material of the insulating sheet 20*b*, at least one kind is selected from a group including aramid fiber, glass fiber, ceramic material, polyimide, mica, and a composite material containing at least one kind of these materials.

The first external terminal 20*a* of the terminal portion 20 has a first end portion 20*a*3 having a first end (a side face at the first end portion 20*a*3 of the first external terminal 20*a*), a second end portion 20*a*4 having a second end (a side face at the second end portion 20*a*4 of the first external terminal 20*a*), and a third end portion 20*a*5 having a third end (a side face at the third end portion 20*a*5 of the first external terminal 20*a*). The first to third end portions 20*a*3 to 20*a*5 are respectively located at three sides surrounding the exposed area 20*a*1. The first end portion 20*a*3 is an end portion along a side at the outer end portion of the first external terminal 20*a*. The second end portion 20*a*4 and the third end portion 20*a*5 are end portions along two sides in a direction orthogonal to the direction in which the exposed area 20*a*1 of the first external terminal 20*a*, the insulating area 20*b*1 of the insulating sheet 20*b*, and the terrace area 20*c*1 of the second external terminal 20*c* are disposed in a plan view.

The rear surface 20*a*6 of the first end portion 20*a*3 of the first external terminal 20*a* is processed as illustrated in FIG. 5. That is, on the rear surface 20*a*6 of the first end portion 20*a*3, a portion closer to the end of the first end portion 20*a*3 is closer to the front surface of the first end portion 20*a*3 than a portion on a rear surface other than the rear surface of the first end portion 20*a*3. In the example illustrated in FIG. 5, a cross section of the first end portion 20*a*3 has a rounded structure having a curvature radius fr_R from the rear surface 20*a*6 to the front surface. Instead of this rounded structure, the rear surface 20*a*6 of the first end portion 20*a*3 may have a curved surface formed by pressing. Alternatively, instead of this rounded structure, the rear surface 20*a*6 of the first end portion 20*a*3 may have a chamfered structure.

A rear surface 20*a*7 of the second end portion 20*a*4 and a rear surface 20*a*8 of the third end portion 20*a*5 of the first external terminal 20*a* are processed as illustrated in FIG. 6. That is, on the rear surface 20*a*7 of the second end portion 20*a*4, a portion closer to the end of the second end portion 20*a*4 is closer to the front surface of the second end portion 20*a*4 than a portion on a rear surface other than the rear surface of the second end portion 20*a*4. In addition, on the rear surface 20*a*8 of the third end portion 20*a*5, a portion closer to the end of the third end portion 20*a*5 is closer to the front surface of the third end portion 20*a*5 than a portion on a rear surface other than the rear surface of the third end portion 20*a*5. In the example in FIG. 6, the rear surface 20*a*7 of the second end portion 20*a*4 and the rear surface 20*a*8 of the third end portion 20*a*5 each have a rounded structure having a curvature radius si_R. Instead of this rounded structure, the rear surfaces 20*a*7 and 20*a*8 of the second end portion 20*a*4 and the third end portion 20*a*5 may have a curved surface formed by pressing. Alternatively, instead of this rounded structure, the rear surfaces 20*a*7 and 20*a*8 may have a chamfered structure.

It is desirable that the curvature radius fr_R of the first end portion 20*a*3 and the curvature radius si_R of the second end portion 20*a*4 and the third end portion 20*a*5 of the first external terminal 20*a* be between 0.5 mm and 1.0 mm, inclusive, or be 40% to 80% of the thickness of the first external terminal 20*a*. The thickness of the first external terminal 20*a* is suitably determined based on the current capacity of the semiconductor device. Herein, the thickness of the first external terminal 20*a* is set to 1.2 mm, for example.

As described above, the rear surface 20*a*6 of the first end portion 20*a*3 along the side at the outer end portion of the first external terminal 20*a* has a rounded structure. In addition, the rear surface 20*a*7 of the second end portion 20*a*4 and the rear surface 20*a*8 of the third end portion 20*a*5 along the two sides of the first external terminal 20*a* have a rounded structure. In this way, the electric field concentration at the first end portion 20*a*3, the second end portion 20*a*4, and the third end portion 20*a*5 is reduced. That is, as illustrated in FIG. 7, compared with a case in which a rounded structure is not used, it is seen that the electric field strength is greatly reduced by the curvature radius fr_R and the curvature radius si_R set to 60% or more of the thickness (1.2 mm) of the first external terminal 20*a*.

While the terminal portion 20 of the semiconductor device 10 according to the first embodiment has been described assuming that the first external terminal 20*a* is used as a positive terminal (a P terminal) and the second external terminal 20*c* is used as a negative terminal (an N terminal), the first external terminal 20*a* may be used as a negative terminal (an N terminal) and the second external terminal 20*c* may be used as a positive terminal (a P terminal).

Second Embodiment

Figure 8A:
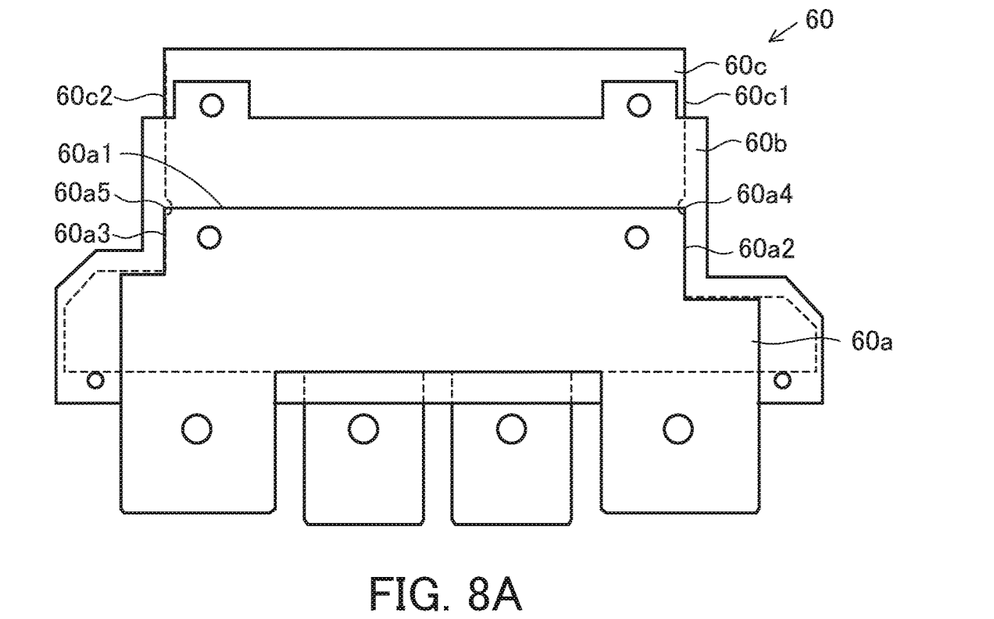
FIGS. 8A and 8B are a plan view and a bottom view of a configuration of a terminal portion of a semiconductor device according to a second embodiment.
Figure 8B:
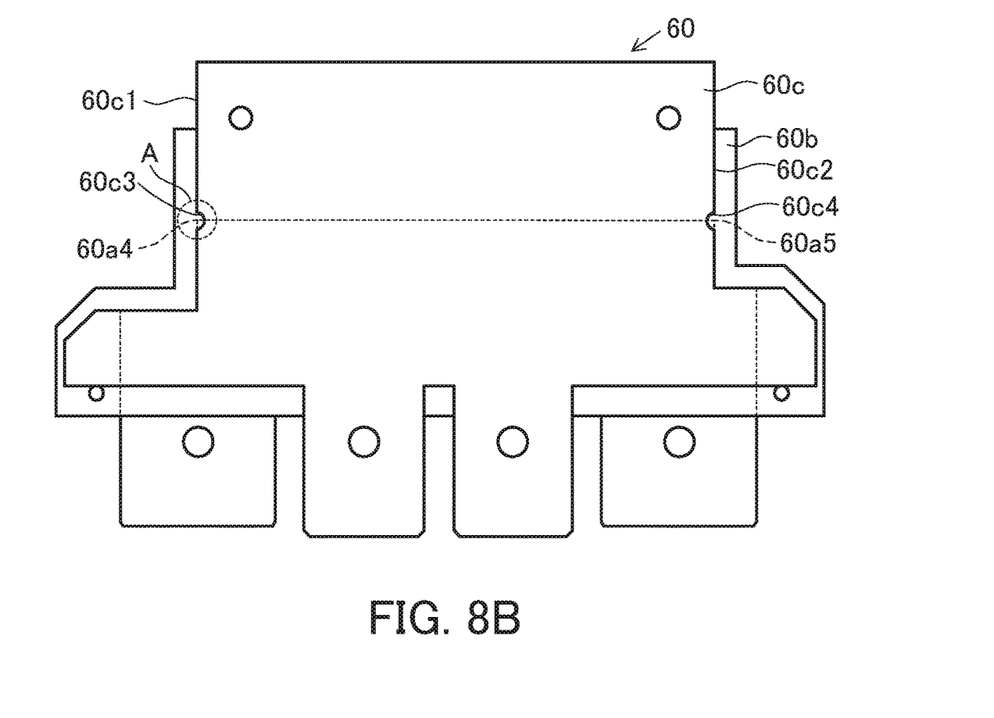
Figure 9:
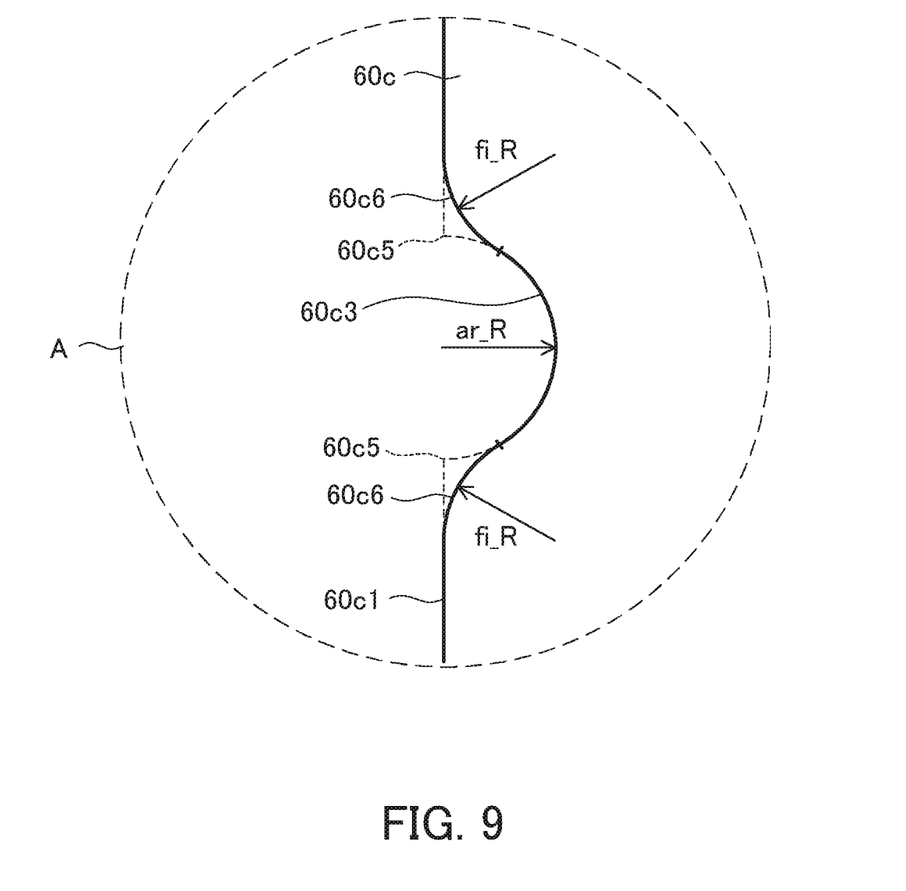
FIG. 9 is an enlarged view of a portion A in FIG. 8B.
Figure 10:
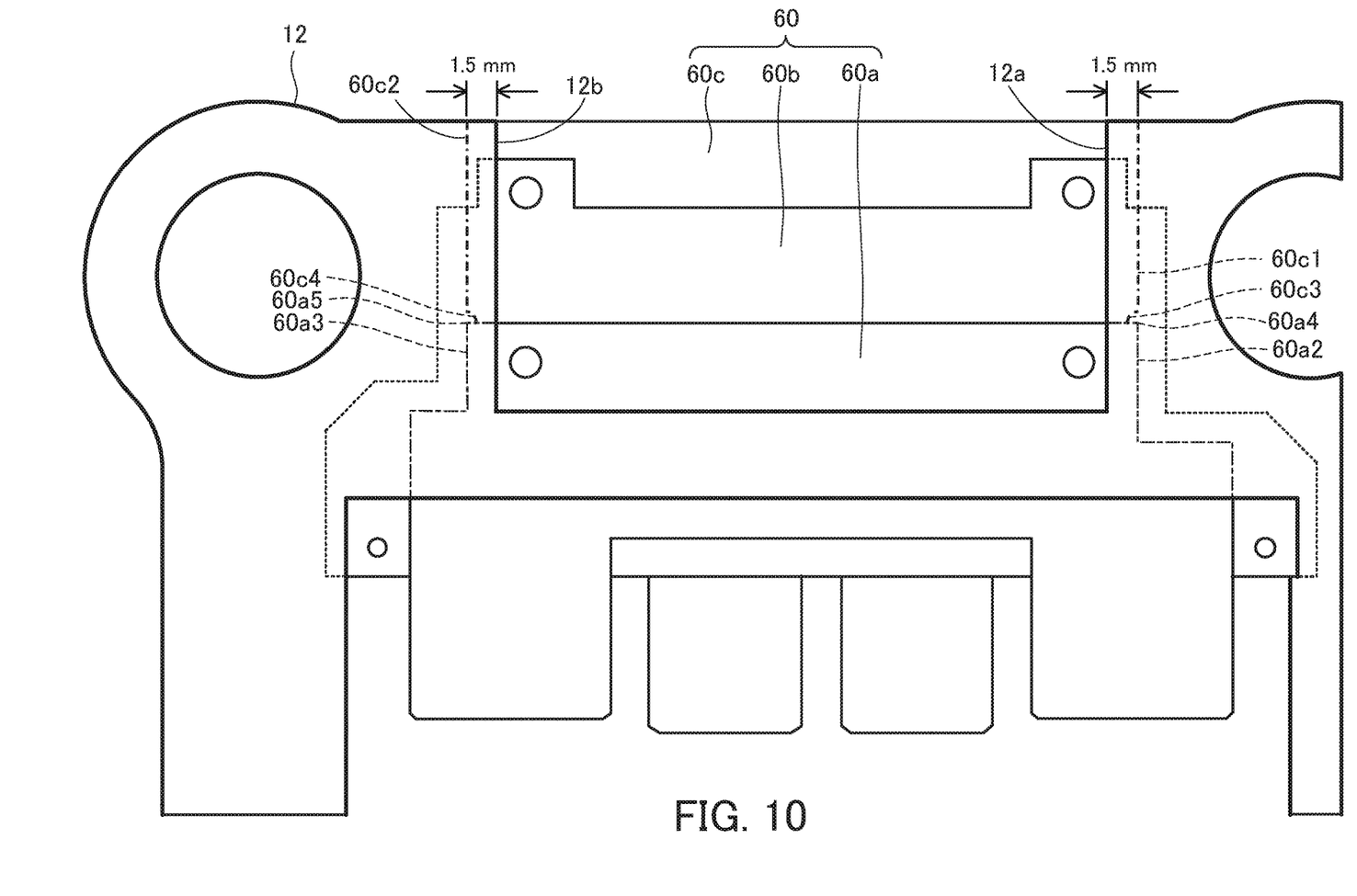
FIG. 10 illustrates the terminal portion sealed with resin in a case.
Figure 11:
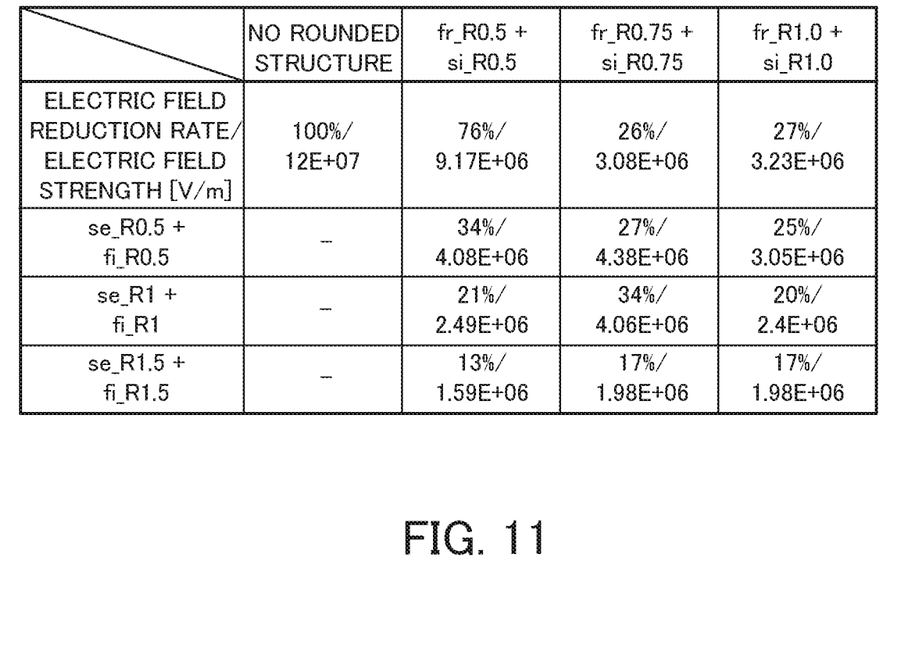
FIG. 11 illustrates an electric field reduction effect.

FIGS. 8A and 8B are a plan view and a bottom view of a configuration of a terminal portion of a semiconductor device according to a second embodiment. FIG. 9 is an enlarged view of a portion A in FIG. 8B. FIG. 10 illustrates the terminal portion sealed with resin in a case. FIG. 11 illustrates an electric field reduction effect.

This terminal portion 60 of the semiconductor device according to the second embodiment has a laminated structure. Specifically, a first external terminal 60*a*, an insulating sheet 60*b*, and a second external terminal 60*c* are disposed in a staircase pattern as illustrated in FIGS. 8A and 8B. As with the terminal portion 20 of the semiconductor device according to the first embodiment, the first external terminal 60*a* has a first end portion 60*a*1, a second end portion 60*a*2, and a third end portion 60*a*3, each of which has a rear surface having a rounded structure not illustrated.

A side of a front surface of the second end portion 60*a*2 and a side of a front surface of the third end portion 60*a*3 of the first external terminal 60*a* of the terminal portion 60 overlap end portions 60*c*1 and 60*c*2 of the second external terminal 60*c* in a plan view. Since the second end portion 60*a*2 and the third end portion 60*a*3 of the first external terminal 60*a* overlap the end portions 60*c*1 and 60*c*2 of the second external terminal 60*c* in a plan view, a larger cross-sectional area of the individual external terminal is ensured in a limited width. Thus, the inductance of the first external terminal 60*a* and the second external terminal 60*c* is reduced, and the power loss is reduced. The first external terminal 60*a* has a corner portion 60*a*4 formed by the first end portion 60*a*1 and the second end portion 60*a*2 and a corner portion 60*a*5 formed by the first end portion 60*a*1 and the third end portion 60*a*3. The second external terminal 60*c* has a notch portion 60*c*3 at a portion of the end portion 60*c*1, the portion facing the corner portion 60*a*4 of the first external terminal 60*a*. The second external terminal 60*c* also has a notch portion 60*c*4 at a portion of the end portion 60*c*2, the portion facing the corner portion 60*a*5 of the first external terminal 60*a*.

Since the notch portions 60c3 and 60c4 are symmetrical to each other, the following description will be made on the notch portion 60c3. The notch portion 60c3 has an arc-like shape having a curvature radius ar_R, and the center of the notch portion 60c3 corresponds to a location facing the corner portion 60a4 of the first external terminal 60a in a plan view, as illustrated in FIG. 9. A corner portion 60c5 formed by the notch portion 60c3 of the second external terminal 60c and the end portion 60c1 of the second external terminal 60c is rounded in an arc-like shape as a fillet 60c6 having a curvature radius fi_R. Since the notch portion 60c3 facing the corner portion 60a4 of the first external terminal 60a is formed at the end portion 60c1 of the second external terminal 60c, the creepage distance between the corner portion 60a4 of the first external terminal 60a and the end portion 60c1 of the second external terminal 60c is extended. Likewise, since the notch portion 60c4 facing the corner portion 60a5 of the first external terminal 60a is formed at the end portion 60c2 of the second external terminal 60c, the creepage distance between the corner portion 60a5 of the first external terminal 60a and the end portion 60c2 of the second external terminal 60c is extended.

The curvature radius ar_R of the notch portion 60c3 is between 0.5 mm and 1.5 mm, inclusive, and the curvature radius fi_R of the fillet 60c6 is between 0.5 mm and 1.5 mm, inclusive. The notch portion 60c3 and the fillet 60c6 of the second external terminal 60c are formed by pressing.

As illustrated in FIG. 10, the second end portion 60a2 and the third end portion 60a3 of the first external terminal 60a, a part of the insulating sheet 60b, and the end portions 60c1 and 60c2 of the second external terminal 60c of the terminal portion 60 are sealed with resin within the case 12. In the example in FIG. 10, the second end portion 60a2 of the first external terminal 60a and the end portion 60c1 of the second external terminal 60c are located inwardly from an edge portion 12a of the case 12 by approximately 1.5 mm, and these portions including the notch portion 60c3 of the second external terminal 60c and the corner portion 60a4 of the first external terminal 60a are sealed with resin. In addition, the third end portion 60a3 of the first external terminal 60a and the end portion 60c2 of the second external terminal 60c are located inwardly from an edge portion 12b of the case 12 by approximately 1.5 mm, and these portions including the notch portion 60c4 of the second external terminal 60c and the corner portion 60a5 of the first external terminal 60a are sealed with resin.

Each of the rear surfaces of the first end portion 60a1, the second end portion 60a2, and the third end portion 60a3 of the first external terminal 60a of the terminal portion 60 has a rounded structure, and the notch portions 60c3 and 60c4 are formed at portions of the end portion 60c1 and 60c2 of the second external terminal 60c, the portions facing the corner portions 60a4 and 60a5 of the first external terminal 60a. There may be cases where only the rounded structures of the first external terminal 60a fail to decrease the electric field strength sufficiently. However, since the notch portions 60c3 and 60c4 are formed as well, the electric field strength is sufficiently decreased. That is, as seen from FIG. 11, even when the curvature radius fr_R and the curvature radius si_R of the above rounded structures are 0.5 mm, it is possible to decrease the electric field strength by increasing the curvature radius ar_R of each of the notch portions 60c3 and 60c4 and the curvature radius fi_R of the fillet 60c6.

While the terminal portion 60 of the semiconductor device according to the second embodiment has been described assuming that the first external terminal 60a is used as a positive terminal (a P terminal) and the second external terminal 60c is used as a negative terminal (an N terminal), the first external terminal 60a may be used as a negative terminal (an N terminal) and the second external terminal 60c may be used as a positive terminal (a P terminal). This is because an examination performed after switching the polarity of first external terminal 60a and the polarity of the second external terminal 60c has indicated the same electric field reduction effect.

The semiconductor device configured as described above is advantageous in that the electric field concentration is reduced. This is because, on the rear surface of an individual end portion described above of the first external terminal facing an insulating sheet, a portion closer to the end of the end portion is more distanced from the second external terminal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device configured for connection to a capacitor, the semiconductor device comprising:
   a terminal portion including:
      a first external terminal having a front surface and a rear surface opposite to each other, the first external terminal having a first end portion configured for connection to one terminal of the capacitor, the first end portion having a first end at an outer periphery thereof;
      a second external terminal having a front surface, the front surface of the second external terminal having a first area located at a periphery thereof and configured for connection to another terminal of the capacitor, and a second area positioned adjacent to and inward of the first area, both the first and second areas extending beyond the first end in a plan view of the semiconductor device, thereby being exposed relative to the first external terminal; and
      an insulating sheet disposed between the rear surface of the first external terminal and the front surface of the second external terminal such that the front surface of the second external terminal is exposed from the insulating sheet, and from the first external terminal at the first area in the plan view, wherein,
   at the first end portion, the rear surface of the first external terminal is angled relative to the front surface of the second external terminal so that, in a thickness direction of the first external terminal, a distance between the rear surface of the first external terminal and the front surface of the second external terminal increases as the first end is approached,
   the first end of the first end portion of the first external terminal extends in a first direction,
   the first external terminal further includes a second end portion having a second end and a third end portion having a third end, the second and third end portions being located along respective ones of two sides of the first external terminal in a second direction orthogonal to the first direction, at each of the second and third end portions, the rear surface of the first external terminal is angled relative to the front surface of the second external terminal so that in the thickness direction, a distance between the rear surface of the first external terminal and the front surface of the second external terminal increases as a corresponding one of the second end or third end is approached, the second external terminal has two side faces that are parallel to each other in the second direction, and the side faces of the second external terminal each have a notch respectively provided at the same positions where a corner formed by the first end of the first end portion and the second end of the second end portion and a corner formed by the first end of the first end portion and the third end of the third end portion are located, each notch being recessed inward from each of the side faces of the second external terminal in the plan view.

2. The semiconductor device according to claim 1, wherein the insulating sheet has a front surface that includes an insulating area located between the first end of the first external terminal and the first area of the second external terminal in the plan view, the insulating area being free of contact with the first external terminal.

3. The semiconductor device according to claim 1, wherein the notches of the second external terminal are sealed with resin.

4. The semiconductor device according to claim 1, wherein in the plan view the notches of the second external terminal each have a semicircular shape having a curvature radius in a range of 0.5 mm to 1.5 mm.

5. The semiconductor device according to claim 4, wherein in the plan view a corner formed by one of the notches of the second external terminal and a corresponding side face of the second external terminal has an arc-like fillet shape having a curvature radius in a range of 0.5 mm to 1.5 mm.

6. The semiconductor device according to claim 1, wherein a part of the second external terminal, a part of the insulating sheet and the second and third end portions of the first external terminal are sealed with resin.

7. The semiconductor device according to claim 1, wherein in cross-sectional views respectively of the first to third ends of the first to third end portions of the first external terminal, the first to third ends each have a rounded shape at the rear surface of the first external terminal.

8. The semiconductor device according to claim 7, wherein the rounded shape of each of the first to third ends of the first to third end portions of the first external terminal has a curvature radius in a range of 0.1 mm to 1.0 mm.

9. The semiconductor device according to claim 1, wherein the first external terminal has a thickness of 0.6 mm or more.

10. The semiconductor device according to claim 1, wherein the insulating sheet has a thickness less than a thickness of the first external terminal.

11. The semiconductor device according to claim 10, wherein the thickness of the insulating sheet is 0.05 mm or more.

12. The semiconductor device according to claim 10, wherein the insulating sheet is a single sheet or a stack of sheets, and the insulating sheet contains at least one material selected from the group consisting of aramid fiber, glass fiber, ceramic material, polyimide, and mica.

13. The semiconductor device according to claim 1, wherein one of the first external terminal or the second external terminal is a positive terminal and the other one of the first external terminal or the second external terminal is a negative terminal.

* * * * *